(12) United States Patent
Bogner

(10) Patent No.: US 10,122,374 B2
(45) Date of Patent: Nov. 6, 2018

(54) METHOD AND APPARATUS FOR ANALOG-TO-DIGITAL CONVERSION USING A TANK CAPACITOR

(71) Applicant: Infineon Technologies AG, Neubiberg (DE)

(72) Inventor: Peter Bogner, Wernberg (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/690,457

(22) Filed: Aug. 30, 2017

(65) Prior Publication Data

US 2018/0076823 A1 Mar. 15, 2018

(30) Foreign Application Priority Data

Sep. 9, 2016 (DE) .................. 10 2016 117 020

(51) Int. Cl.
| | | |
|---|---|---|
| *H03M 1/00* | (2006.01) | |
| *H03M 1/12* | (2006.01) | |
| *H03M 1/38* | (2006.01) | |

(52) U.S. Cl.
CPC ....... *H03M 1/1255* (2013.01); *H03M 1/1245* (2013.01); *H03M 1/38* (2013.01)

(58) Field of Classification Search
CPC .................................................. H03M 1/1255
USPC ................................................ 341/122–155
See application file for complete search history.

(56) References Cited

U.S. PATENT DOCUMENTS

| | | | | |
|---|---|---|---|---|
| 5,841,996 A | * | 11/1998 | Nolan .................... | H02J 7/0011 320/112 |
| 6,567,021 B1 | * | 5/2003 | Burns .................... | H03M 1/108 341/120 |
| 7,592,819 B2 | | 9/2009 | Kawate et al. | |
| 2005/0073451 A1 | * | 4/2005 | Bocko ................. | H04N 5/23241 341/143 |
| 2008/0036639 A1 | * | 2/2008 | Wakamatsu ........ | H03M 1/0695 341/155 |
| 2009/0058468 A1 | * | 3/2009 | Hjelm .................... | G01R 23/09 327/40 |
| 2009/0109718 A1 | * | 4/2009 | Wu ....................... | H02M 3/157 363/147 |

(Continued)

FOREIGN PATENT DOCUMENTS

| | | |
|---|---|---|
| DE | 102015101614 A1 | 8/2015 |
| WO | WO-2015167478 A1 | 11/2015 |

OTHER PUBLICATIONS

German Patent Office, Office Action issued for DE 102016117020.8, 10 pgs., dated May 7, 2017.

*Primary Examiner* — Lam T Mai
(74) *Attorney, Agent, or Firm* — Schiff Hardin LLP

(57) ABSTRACT

An apparatus for converting an analog signal to a digital signal comprises an input node to be set to an input voltage that is based on the analog signal. The input node is configured to be coupled to a tank capacitor to receive charge from the tank capacitor. The apparatus further comprises a current source configured to be coupled to the tank capacitor to change an amount of charge stored on the tank capacitor. A method for use in operating an analog-to-digital converter to convert an analog signal into a digital signal comprises, in a sensing mode, setting an input voltage based on the analog signal to a sampling capacitor and, in a non-sensing mode, providing a sample voltage to a comparator.

19 Claims, 3 Drawing Sheets

(56) References Cited

U.S. PATENT DOCUMENTS

| | | | | |
|---|---|---|---|---|
| 2010/0013448 A1* | 1/2010 | Motz | ............ | G05F 1/575 323/280 |
| 2011/0291731 A1* | 12/2011 | Javerliac | ............ | H03H 11/265 327/281 |
| 2014/0306722 A1* | 10/2014 | Kim | ............ | G06F 3/0416 324/658 |
| 2015/0228355 A1* | 8/2015 | Bogner | ............ | G11C 27/024 341/122 |

* cited by examiner

METHOD AND APPARATUS FOR ANALOG-TO-DIGITAL CONVERSION USING A TANK CAPACITOR

FIELD OF THE INVENTION

The present invention relates to analog-to-digital conversion of an analog signal to a digital signal.

BACKGROUND OF THE INVENTION

Measurements provide analog measurement values. In a continuous measurement, the analog measurement values form an analog measurement waveform. For processing in a microcontroller, the analog waveform needs to be converted to digital values. An analog voltage can represent the analog measurement value. Accordingly, an analog voltage signal can represent the analog measurement waveform. An analog-to-digital converter (ADC) can convert the analog voltage signal into a digital representation. In particular, the ADC converts a continuous analog waveform into a discrete digital representation.

A sensor can be used to perform measurements and output the analog voltage signal to the ADC. An electrical conductor line can be used as a medium to transmit the analog voltage signal to the ADC. The sensor can be exposed to mechanical and thermal stress. Similarly, the electrical conductor line can be exposed to mechanical and thermal stress. As a result, functionality of the sensor and the electrical conductor line can be compromised or completely be lost.

One type of ADC uses successive approximation. A successive approximation ADC is a type of ADC that converts the continuous analog waveform into discrete digital representation via a binary search through all possible quantization levels before finally converging upon a digital output for each conversion. One type of ADC that uses successive approximation comprises a sampling capacitor that, based on the analog voltage signal, can be charged. At one point in time, the sampling capacitor can provide a fixed sample voltage to be converted into the digital voltage by successive approximation. Sometimes, leakage occurs from the sampling capacitor. Likewise, where the sampling capacitor is charged from a reservoir, the reservoir can also suffer leakage.

SUMMARY

In one aspect, an apparatus for converting an analog signal to a digital signal comprises an input node to be set to an input voltage that is based on the analog signal. The input node is configured to be coupled to a tank capacitor to receive charge from the tank capacitor. The apparatus further comprises a current source configured to be coupled to the tank capacitor to change an amount of charge stored on the tank capacitor.

In another aspect, a processing unit is configured to control an apparatus for converting an analog signal to a digital signal. The processing unit comprises a sampling capacitor and a tank capacitor that is coupled to the sampling capacitor. The sampling capacitor is coupled to an input node to be set to an input voltage that is based on the analog signal. The sampling capacitor is configured in particular, when operating in a sampling mode, to exchange charge with the tank capacitor, and, when operating in a hold mode, to hold a sample voltage. The apparatus further comprises a current source that is coupled to the tank capacitor. The current source is configured to change an amount of charge stored on the tank capacitor. The processing unit is configured to process a tank voltage across the tank capacitor. In some embodiments, the processing unit is configured to provide an indication, if, during a predetermined duration of operation, a drop of tank voltage exceeds a threshold.

In another aspect a method for use in operating an analog-to-digital converter to convert an analog signal into a digital signal comprises, in a sensing mode, setting an input node of the ADC to an input voltage that is based on the analog signal to a sampling capacitor and, in a non-sensing mode, providing a sample voltage to a comparator. The method comprises, when operating in the sensing mode, switching the current source to the tank capacitor to change an amount of a charge stored on the tank capacitor. Further, the method comprises switching a current source to the tank capacitor, and, using the input voltage to derive a digital voltage.

The independent claims define the invention in various aspects. The dependent claims state embodiments according to the invention in various aspects.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention.

DETAILED DESCRIPTION

Figure 1:
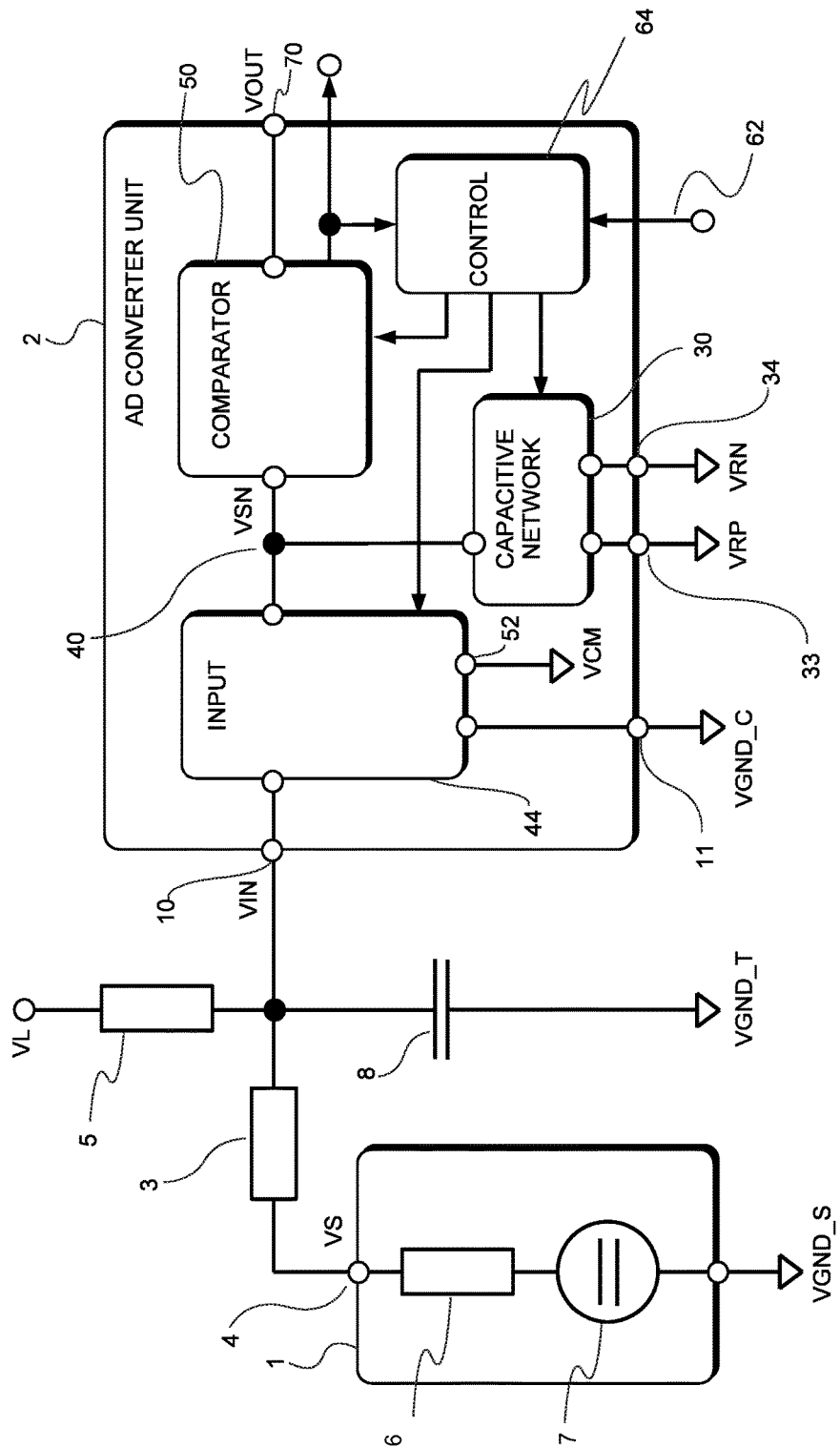
FIG. 1 is a block diagram schematically illustrating an exemplary apparatus according to some embodiments.

Below, embodiments, implementations and associated effects are disclosed with reference to the accompanying drawings. The elements of the drawings are not necessarily to scale relative to each other. Like reference numerals designate corresponding similar parts. Other embodiments according to the present invention and many of the intended advantages of the present invention will be readily appreciated as they become better understood by reference to the following detailed description. It is to be understood that other embodiments may be utilized and structural or logical changes may be made without departing from the scope of the present invention. The following detailed description, therefore, is not to be taken in a limiting sense, and the scope of the present invention is defined by the appended claims.

FIG. 1 is a block diagram schematically illustrating an exemplary apparatus according to some embodiments. To give an overview, a sensor system comprises a sensor unit 1 and an analog-to-digital (AD) converter unit 2. As will be explained in more detail below, the sensor unit 1 is configured to sense a physical quantity and to form an analog voltage signal that reflects a detected value of the physical quantity. The physical quantity can change over time. Correspondingly, the detected value and the analog voltage signal can vary. The sensor unit 1 is coupled to the AD converter unit 2.

The AD converter unit 2 is generally provided as an apparatus that is configured for converting an analog signal to a digital signal. Accordingly, the AD converter unit 2 is configured to receive an input-signal voltage VIN from the sensor unit 1. The AD converter unit 2 can process the input-signal voltage VIN to output a digital output-signal voltage VOUT to represent the input-signal voltage VIN. Where the input-signal voltage VIN received at the AD converter unit 2 corresponds to the analog voltage signal formed by the sensor unit, the digital output-signal voltage VOUT forming a bit sequence, can essentially represent the detected value of the physical quantity under investigation by the sensor unit 1.

Now, with reference to FIG. 1 in more detail, the sensor unit 1 comprises a transducer 7 that is configured to sense the physical quantity and to generate a voltage drop across an internal sensor resistance 6 that sets an output node 4 of the sensor unit 1 to a sense voltage VS. The voltage drop is commensurate with the value physical quantity and provides for a sense current to flow in the internal sensor resistance 6 of the sensor unit 1. The physical quantity can be anything that the transducer 7 is designed to detect, for example, pressure, temperature, or acceleration. In some embodiments, the physical quantity can change over time.

In the example illustrated in FIG. 1, the AD converter unit 2 comprises an input portion 44 that is coupled to an input terminal 10 of the AD converter unit 2 and to a ground terminal 11. The AD converter unit 2 comprises a comparator portion 50 that is coupled to the input portion 44 and to an output terminal 70. In some embodiments, as shown in FIG. 1, the AD converter unit 2 is provided as a successive approximation analog-to-digital converter (SAR-ADC). Accordingly, the AD converter unit 2 further comprises a reference capacitance 30 that, via a sense node 40, is coupled to the input portion 44 and to the comparator portion 50. While herein, for the sake of disclosing an example, a SAR-ADC example of the AD converter unit 2 is discussed, it should be understood that the skilled person can contemplate other embodiments of the AD converter such as a sigma-delta analog-to-digital converter or a pipelined analog-to-digital converter.

In some embodiments, a control unit 64 is provided. In some embodiments, the control unit 64 is configured to process an output signal from the comparator portion 50, for example the digital output-signal voltage VOUT, and to form, based on the output signal, a control signal for use in control of the apparatus. In an embodiment, the control unit 64 can output the control signal to the reference capacitance 30, for example, for use in control of the capacitive network in reference capacitance 30. In some embodiments, the control unit 64 is configured to process an external control signal provided to the control unit 64 via an external control portion 62. In some embodiments, the control unit 64 is configured to control the input portion 44 as will be described in more detail below. The control unit 64 can be any processing means, for example a microcontroller, or a programmable logic device, in particular, configured to or adapted to perform the acts described herein. The control unit 64 can be co-located with or form a portion of the AD converter unit 2. In some embodiments, the control unit 64 is located external to the AD converter unit 2.

The structure of the AD converter unit 2 will now be described in more detail with reference to FIG. 2.

Figure 2:
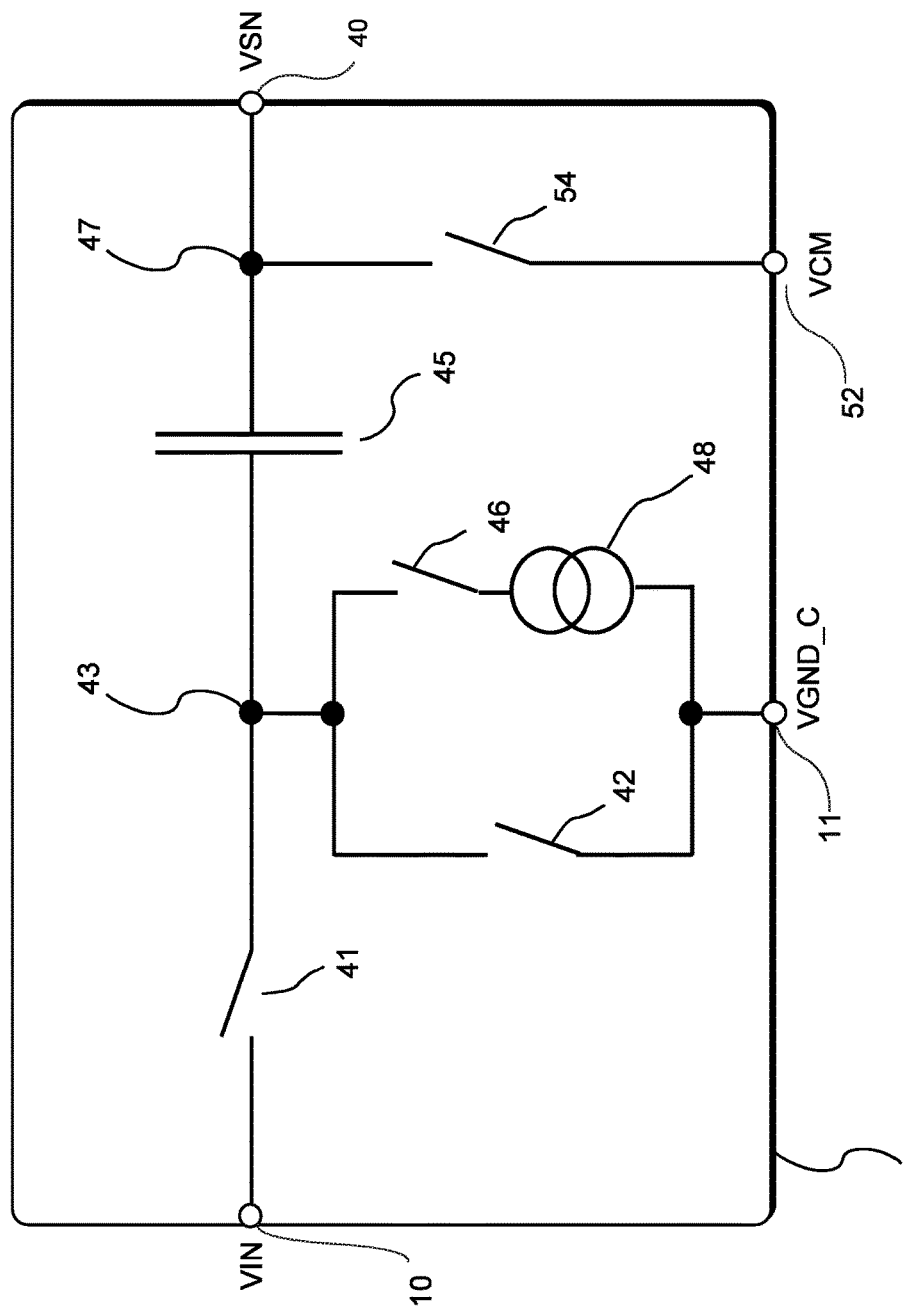
FIG. 2 shows a block diagram that illustrates an exemplary detail of the circuit shown in FIG. 1.

FIG. 2 shows a block diagram that illustrates an exemplary detail of the circuit of the AD converter unit 2 shown in FIG. 1. The input portion 44 of the circuit in the AD converter unit 2 includes an input capacitor 45 having a first conductor coupled, via an input node 43 and an input switch 41, to the input terminal 10. Further, the first conductor is coupled, via the input node 43 and a discharge switch 42, to the ground terminal 11. The input capacitor 45 has a second conductor that is coupled, via a common mode node 47, to the sense node 40. The input portion 44 is configured such that the common mode node 47 can be set, via a common mode switch 54, to a common mode potential 52. In particular, the common mode switch 54 is configured to be closed during a sampling phase and to be open during a hold phase.

In some embodiments, the circuit is configured to have the input node 43 set to the input-signal voltage VIN while the common mode switch 54 is open. In some embodiments, the input switch 41 is configured to be open with the circuit in a non-sensing mode during a charge phase of 'refreshing' the charge on the input capacitor 45 and the reference capacitance 30 and to be closed during an operative phase of the circuit in a sensing mode where, for example, the input-signal voltage is to be sensed. In some embodiments, the AD converter unit 2 is configured to have the input capacitor 45 set to a reference input voltage level VGND_C while the common mode switch 54 is closed.

Further, the input portion 44 comprises a current source arrangement that is coupled to the input terminal 10. In particular, the current source arrangement is coupled in parallel to the discharge switch 42. The current source arrangement comprises a current source 48 and a current source switch 46. In some embodiments the current source switch 46 is coupled between the current source 48 and the input node 43. In some embodiments (not shown) the current source switch 46 is coupled between the current source 48 and the input terminal 10. The current source switch 46 can be configured to be controlled, for example, by the control unit 64.

Now, again referring to FIG. 1, due to the coupling of the sensor unit 1 to the AD converter unit 2, the input terminal 10 of the converter unit 2 can be set to an input-signal voltage VIN that is based on the sense voltage VS at the output node of the sensor unit 1. The coupling between the sensor unit 1 and the AD converter unit 2 is described in more detail. The coupling comprises a wire line that connects the sensor unit 1 to the AD converter unit 2. The wireline has a line resistance 3. Further, a tank capacitor 8 is coupled between the wireline and a ground potential VGND_T. The tank capacitor 8 is configured for use as a charge reservoir in operation of the AD converter unit 2. The input terminal 10 of the converter unit 2 can thus exchange charge with the tank capacitor 8. In some embodiments, the tank capacitor 8 can be used to charge the sampling capacitor 45.

The apparatus is configured to detect a tank voltage across the tank capacitor 8. Though typically not desired, charge can leak from the coupling, in particular from the tank capacitor 8. A leak resistance 5 schematically illustrates a current path to a leak potential VL. If the current source switch 46 of the input portion 44 is closed, an amount of charge stored on the tank capacitor 8 can change. In particular, the tank capacitor 8 can be discharged.

An exemplary operation of the above-described embodiment, wherein a tank capacitor is coupled to the analog-to-digital converter, will now be described.

First, the AD converter unit 2 is initialized. Initialization can comprise closing the common mode switch 54 of the input portion 44 in the AD converter unit 2. Thus, an offset of the comparator circuit 55 can be adjusted for operation. Once the comparator circuit 55 is thus settled to a balanced state, the common mode switch 54 is opened and the AD converter unit 2 becomes ready for operation as described below.

The sensor unit 1 and the AD converter unit 2 are operated to form, based on an analog signal at the sensor unit 1, a digital signal. In an implementation, a method for use in operation of the above-described apparatus to convert the analog signal into a digital signal comprises using the sensor unit 1 to sense a physical quantity, for example a pressure. The exemplary method comprises forming an analog signal, for example, a sense voltage VS, that reflects a detected value of the physical quantity. For example, the sense voltage VS represents a pressure value. The pressure value can vary as the pressure changes over time. Therefore, the sense voltage VS can change with time. The output node 4 of the sensor unit is set to the sense voltage VS.

Using the wireline that couples the sensor unit 1 to the AD converter unit 2, the analog sense voltage VS is transmitted to the input terminal 10 of the AD converter unit 2. Based on the analog sense voltage VS, an input-signal voltage VIN is provided to the AD converter unit 2. Due to the line resistance 3, the input-signal voltage VIN can be reduced with respect to the sense voltage. However, if the conductance of the wireline is typical, the drop in voltage, i.e., the difference between the sense voltage VS and the input-signal voltage VIN can sometimes be neglected; in such a case VIN≈VS. In some embodiments, the sensor unit 1 and the AD converter unit 2 do not use the same ground potential, i.e., VGND_S≠VGND_C. It should be understood that in such a case VIN can be larger than VS.

Figure 3:
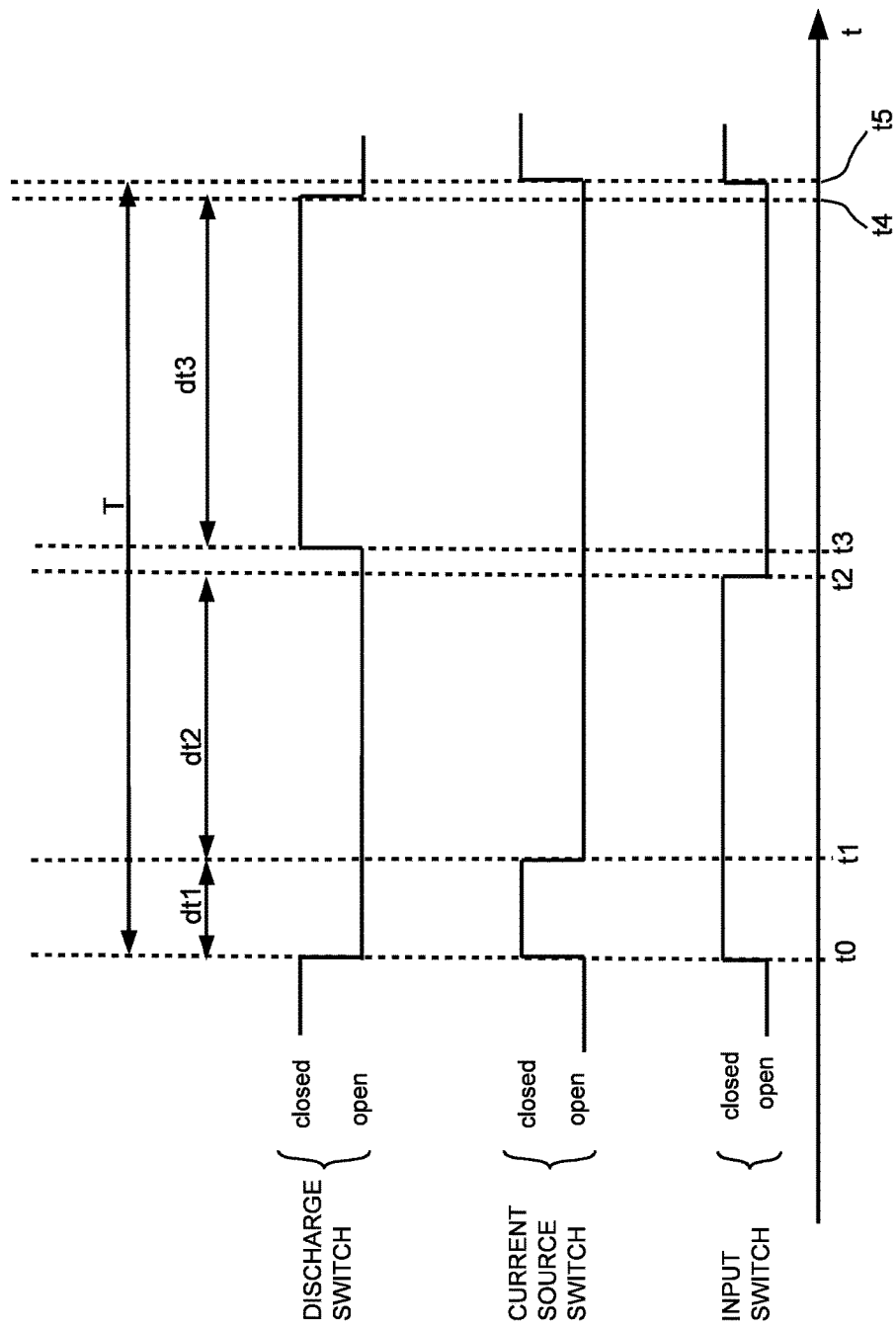
FIG. 3 is a timing diagram that illustrates switch states in the apparatus illustrated in FIGS. 1 and 2.

In operation, the AD converter unit 2 performs a plurality of operative cycles that each last a period T. An exemplary operative cycle includes operating in the sensing mode and, thereafter, operating in the non-sensing mode. A schedule can be predetermined to establish when, in one operative cycle, the AD converter unit 2 operates in the sensing mode and when the AD converter unit 2 operates in the non-sensing mode. Further, the schedule can predetermine an interval in one operative cycle, when the current source 48 is connected to the tank capacitor 8. In some implementations, the schedule can be the same for the plurality of operative cycles of the AD converter unit 2. The control unit 64 can thus compare a plurality of voltage levels associated with the plurality of operative cycles, respectively. One exemplary operative cycle of operation will now be described with reference to FIG. 3 which is a timing diagram that illustrates switch states, for example, in the apparatus illustrated in FIGS. 1 and 2.

Now, looking more closely at the operation of the AD converter unit 2, the AD converter unit 2 starts from an initial setting, where the input switch 41, the current source switch 46 and the discharge switch 42 that are comprised in the input unit 44 are open. Having concluded initialization, in particular, having set the common mode switch 54 to open, at a time t0, the AD converter unit 2 begins operation and enters the sensing mode. In particular, the input switch 41 is closed. Thus, the input-signal voltage VIN is set to the input capacitor 45. In accordance with the input-signal voltage VIN, the input capacitor 45 exchanges charge with the tank capacitor 8. For example, the input capacitor 45 receives charge from the tank capacitor 8. Thus, the input-signal voltage VIN is sampled.

After a sensing mode interval according to the predetermined schedule has passed, at a time t2, the AD converter unit 2 enters into a non-sensing mode. The input switch 41 is opened. Thus, the input-signal voltage VIN is no longer applied to the input capacitor 45. The input capacitor 45 now stores an amount of charge that is not altered by the input-signal voltage VIN.

Next, at a time t3, in the non-sensing mode, the AD converter unit 2 enters the hold mode, where the discharge switch 42 is closed such that the input capacitor 45 is switched to ground VGND_C. In the hold mode, charge is redistributed, via the sense node 40 of the AD converter unit 2, between the capacitive network 30 and the input-capacitor 45. Thus, a sample voltage across the input capacitor 45 contributes to the sense-node voltage VSN at the sense node 40. The sense-node voltage VSN is applied to the comparator circuit 55 to form the digital output-signal voltage VOUT to be set to the output terminal 70 of the AD converter unit 2. In successive approximation steps, the capacitive network is switched based on the digital output-signal voltage VOUT of the comparator circuit 55 in the comparator portion 50, whereby one value of the sampled analog signal as represented by the sample voltage is converted into a digital signal representation.

At time t4, after a hold mode interval according to the predetermined schedule has passed with the AD converter unit 2 operating in the hold mode, the discharge switch 42 is opened.

At a time t5, the AD converter unit 2 ends one operative cycle and enters the sensing mode of the next operative cycle. In particular, the input switch 41 is closed again whereby the input-signal voltage VIN is set to the sample capacitor 45.

Meanwhile, during a tank reset interval dt1 starting from the time t0, the current source switch 46 is closed. Thereby, the current source 48 can discharge (or, as the case may be, charge) the tank capacitor 8. At least one effect can be that charge on the tank capacitor 8 is reset to a predetermined level. Because of the current source 48 being switched to the tank capacitor 8, the sampling voltage does not accurately reflect the input-signal voltage VIN at the input terminal 10.

In some implementations, the predetermined schedule provides for the tank reset interval at a time when accuracy of the sample voltage is not paramount. For example, when entering the sensing mode, time is initially required to charge the input capacitor 45 before reaching an accurate sample voltage. Therefore, this initial time can conveniently be used for the tank reset interval dt1 in order to discharge the tank capacitor 8 via the current source 48. Accordingly, in some implementations, the tank reset interval dt1 ends at the time t1 within the sampling interval dt0, i.e., before the AD converter unit 2 leaves the sensing mode at the time t2 to enter, at the time t3, the hold mode. In other words, the current source switch 46 is opened and the current source 48 is disconnected from the tank capacitor 8 at the time t1, when the AD converter unit 2 still continues for some time to operate in the sensing mode. At least one effect can be that an accurate sample of the input-signal voltage can now be completed starting at the time t1, until the input switch 41 is opened for the AD converter unit 2 to enter the non-sensing hold mode.

In the embodiment illustrated in FIG. 2, in order to enable an exchange of charge between the current source 48 and the tank capacitor 8 via the input terminal 10 of the AD converter unit 2 and via the input node 43 of the input portion 44 of the circuit in the AD converter unit 2, the input switch 41 must be closed. In this embodiment, the connection of the current source 48 to the tank capacitor 8 is thus restricted to a time interval when the AD converter unit 2 operates in the sensing mode, i.e., starting at the time t0. It should be understood that the person skilled in the art can contemplate a different arrangement (not shown) where the current source switch 46 connects directly to input terminal 10. In such an arrangement the current source 48 can also be used to exchange charge with the tank capacitor 8 while the AD converter unit 2 is operated in the non-sensing mode, in particular, while the AD converter unit 2 is operated in the hold mode.

Meanwhile, using the AD converter unit 2, the tank voltage across the tank capacitor 8 can be monitored. In particular, an unusual change of the tank voltage can be detected. At least one effect can be that in the event that the coupling of the sensor unit 1 to the AD converter unit 2 is impaired, an increase in the wireline resistance 3 can be noticed and interpreted accordingly. For example, if the conductance of the wireline that connects the sensor unit 1 to the AD converter unit 2 decreases or if the wireline breaks, the increase in wireline resistance 3 can be steep. Accordingly, during discharge of the tank capacitor 8 the input-signal voltage VIN can become rather small. In particular, in the event of a broken or otherwise disconnected wireline, during discharge of the tank capacitor 8 by the current source 48 the input-signal voltage VIN would become unusually small. Consequently, the input capacitor 45 would exchange less charge with the tank capacitor 8.

The control unit 64 can be operative to determine if the tank voltage across the tank capacitor 8 falls below a predetermined threshold level. Upon determination of such fall in voltage an indication can be provided, for example to the user, that is indicative of the coupling between the sensor unit 1 and the AD converter unit 1 possibly being defective or otherwise out of order. In some implementations, the control unit 64 of the AD converter unit 1 determines, if the sampling capacitor 45 leaks charge, whereby an unusually large amount of charge needs to be drawn from the tank capacitor 8. In some implementations, where an assumption can be made about the analog signal upon which the input-signal voltage is based, the control unit 64 can be used to determine, if the input-signal voltage VIN changes irrespective of the analog signal.

The disclosed arrangements may be implemented partially or fully in hardware using logic circuits or VLSI design.

In the above description of exemplary implementations, for purposes of explanation, specific numbers, materials configurations, and other details are set forth in order to better explain the invention, as claimed. However, it will be apparent to one skilled in the art that the claimed invention may be practiced using different details than the exemplary ones described herein.

Some or all method steps described herein may be executed by (or using) a hardware apparatus, like for example, a microprocessor, a programmable computer or an electronic circuit.

One embodiment includes a processing means, for example a computer, or a programmable logic device, configured to or adapted to perform one of the methods described herein.

It is to be understood that the features of the various embodiments described herein may be combined with each other, unless specifically noted otherwise.

Exemplary implementations/embodiments discussed herein may have various components collocated; however, it should be appreciated that the components of the arrangements may be combined into one or more apparatuses.

In some instances, well-known features are omitted or simplified to clarify the description of the exemplary implementations.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein.

It is intended that this invention be limited only by the claims and the equivalents thereof.

The invention claimed is:

1. An apparatus, for converting an analog signal to a digital signal, the apparatus comprising
   an input node to be set to an input voltage that is based on the analog signal and configured to be coupled to a tank capacitor to receive charge from the tank capacitor;
   a current source configured to be coupled to the tank capacitor to change an amount of charge stored on the tank capacitor; and
   a sampling capacitor coupled to the input node and configured to hold, when operating in a non-sensing mode, a sample voltage, and configured to receive, when operating in the sensing mode, charge from the tank capacitor.

2. The apparatus of claim 1,
   wherein the apparatus is configured to control the current source such that the current source connects to the tank capacitor discontinuously.

3. The apparatus of claim 2,
   wherein the apparatus is configured to have the current source disconnected from the tank capacitor when operating in a sensing mode.

4. The apparatus of claim 3,
   comprising a sampling switch that is coupled between the input node and the sampling capacitor,
   wherein the apparatus is configured to control the sampling switch so as to be closed when operating in the sensing mode and to be open when operating in the non-sensing mode.

5. The apparatus of claim 4,
   wherein the apparatus is configured to synchronize a control of the current source to the control of the sampling switch.

6. The apparatus of claim 5,
   wherein the apparatus is configured to control the current source and the sampling switch so as to maintain a constant phase relation between at least one of:
   disconnecting the current source from the tank capacitor and opening the sampling switch,
   closing the sampling switch and connecting the current source to the tank capacitor, and
   closing the sampling switch and disconnecting the current source from the tank capacitor.

7. The apparatus of claim 1,
   wherein the current source comprises a current source switch configured to switch the current source to either connect to the tank capacitor or to disconnect from the tank capacitor, and
   the apparatus further comprising a control unit configured to perform control operations,
   wherein the control unit is configured to provide a current source switch signal to the current source switch.

8. The apparatus of claim 4,
   wherein the sampling switch is configured to switch the sampling capacitor either, when closed, to connect to the input node or, when open, to disconnect from the input node.

9. The apparatus of claim 1, the apparatus further comprising a comparator coupled to the sampling capacitor and configured to output a digital voltage signal based on the sample voltage.

10. The apparatus of claim 1, the apparatus further comprising
a digital-to-analog capacitor coupled to the comparator, wherein the digital-to-analog capacitor is configured to be charged based on the digital voltage signal.

11. The apparatus of claim 10,
wherein the digital voltage signal is based on a difference between the sample voltage and a voltage based on charge redistributed between the sampling capacitor and at least the digital-to-analog capacitor.

12. A processing unit, configured to control an apparatus for converting an analog signal to a digital signal, the apparatus comprising:
a sampling capacitor coupled to an input node to be set to an input voltage that is based on the analog signal,
a tank capacitor coupled to the sampling capacitor,
wherein the sampling capacitor is configured, when operating in a sampling mode, to exchange charge with the tank capacitor, and, when operating in a hold mode, to hold a sample voltage,
the apparatus further comprising a current source coupled to the tank capacitor, wherein the current source is configured to change an amount of charge stored on the tank capacitor,
wherein the processing unit is configured to process a tank voltage across the tank capacitor.

13. The processing unit of claim 12,
wherein the processing unit is configured provide an indication, if, during a predetermined duration of operation, a drop of tank voltage exceeds a threshold.

14. A method for use in operating an analog-to-digital converter to convert an analog signal into a digital signal, wherein a tank capacitor is coupled to the analog-to-digital converter, the method comprising:
setting an input node of the analog-to-digital converter to an input voltage that is based on the analog signal;
switching a current source to the tank capacitor to change an amount of charge stored on the tank capacitor;
disconnecting the current source from the tank capacitor;
using the input voltage to derive a digital voltage;
in a sensing mode, setting the input voltage to a sampling capacitor,
in a non-sensing mode, providing a sample voltage of the sampling capacitor to a comparator; and
using the tank capacitor to charge the sampling capacitor.

15. The method of claim 14, the method further comprising:
when operating in the sensing mode, disconnecting the current source from the tank capacitor.

16. The method of claim 15, the method further comprising:
monitoring a tank voltage across the tank capacitor, and
determining if the tank voltage across falls below a predetermined threshold level.

17. The method of claim 16, the method further comprising at least one of:
determining if the sampling capacitor leaks charge, and
determining if the input voltage changes irrespective of the analog signal.

18. The method of claim 17, the method comprising
performing a plurality of operative cycles, each operative cycle including operating in the sensing mode and, thereafter, operating in the non-sensing mode,
wherein the processing includes comparing a plurality of voltage levels associated with the plurality of operative cycles, respectively.

19. The method of claim 18,
wherein a schedule of operating the analog-to-digital converter in the sensing mode, operating the analog-to-digital converter in the non-sensing mode and having the current source connected to the tank capacitor is the same for the plurality of operative cycles.

* * * * *